(12) United States Patent
Shi et al.

(10) Patent No.: US 12,379,803 B2
(45) Date of Patent: Aug. 5, 2025

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Jiafan Shi, Beijing (CN); Liqiang Chen, Beijing (CN); Shengxing Zhang, Beijing (CN); Yang Yang, Beijing (CN); Wenliang Liu, Beijing (CN); Xin Zhang, Beijing (CN); Yangjie Wan, Beijing (CN); Qian Yin, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/701,940

(22) PCT Filed: May 9, 2023

(86) PCT No.: PCT/CN2023/093067
§ 371 (c)(1),
(2) Date: Apr. 17, 2024

(87) PCT Pub. No.: WO2023/226751
PCT Pub. Date: Nov. 30, 2023

(65) Prior Publication Data
US 2024/0411393 A1    Dec. 12, 2024

(30) Foreign Application Priority Data
May 26, 2022   (CN) .................... 202210588844.7

(51) Int. Cl.
*G06F 3/041*  (2006.01)
*G06F 3/044*  (2006.01)
(Continued)

(52) U.S. Cl.
CPC ........ *G06F 3/0412* (2013.01); *G06F 3/04164* (2019.05); *G06F 3/0446* (2019.05);
(Continued)

(58) Field of Classification Search
None
See application file for complete search history.

(56) References Cited

U.S. PATENT DOCUMENTS

2018/0059862 A1*   3/2018   Zeng .................... H10K 59/873

FOREIGN PATENT DOCUMENTS

| CN | 106951125 A | 7/2017 |
| CN | 112667106 A | 4/2021 |

(Continued)

OTHER PUBLICATIONS

International Search Report for PCT/CN2023/093067 Mailed Aug. 31, 2023.

*Primary Examiner* — Brian M Butcher
(74) *Attorney, Agent, or Firm* — Ling Wu; Stephen Yang; Ling and Yang Intellectual Property

(57) ABSTRACT

A display panel and a display apparatus. The display panel is provided with a display area and a non-display area surrounding the display area. The non-display area comprises a border area (BA). The display panel comprises a display substrate. The display substrate comprises a first metal layer (600); a touch layer, which is provided with a touch electrode and a touch wire connected to the touch electrode, the touch electrode being arranged in the display area; a drive circuit (900) which is provided in the non-display area; and a wire passage hole (700), which is arranged in the border area (BA). The touch wire is connected to a metal lead of the first metal layer (600) through the wire passage hole (700), and the metal lead is configured to be connected to the driving circuit (900).

19 Claims, 4 Drawing Sheets

(51) Int. Cl.
  *H10K 59/40* (2023.01)
  *H10K 59/80* (2023.01)
  *H10K 59/88* (2023.01)
(52) U.S. Cl.
  CPC ........... *H10K 59/40* (2023.02); *H10K 59/873* (2023.02); *H10K 59/88* (2023.02)

(56) References Cited

FOREIGN PATENT DOCUMENTS

| | | |
|---|---|---|
| CN | 110265459 B | 4/2022 |
| CN | 114924657 A | 8/2022 |
| WO | 2022047800 A1 | 3/2022 |

* cited by examiner

DISPLAY PANEL AND DISPLAY APPARATUS

CROSS-REFERENCE TO RELATED APPLICATION

The present application is a U.S. National Phase Entry of International Application No. PCT/CN2023/093067 having an international filing date of May 9, 2023, which claims priority to Chinese Patent Application No. 202210588844.7 entitled "Display Panel and Display Apparatus" and filed to the CNIPA on May 26, 2022. Contents of the above-identified applications should be construed as being incorporated herein by reference.

TECHNICAL FIELD

Embodiments of the present disclosure relate to, but are not limited to, the field of display technology, and in particular to a display panel and a display apparatus.

BACKGROUND

At present, with the rapid development of OLED (Organic Light-Emitting Diode) display industry, a large number of new display apparatuses are gradually pouring into the market. In order to obtain a larger screen-to-body ratio and provide customers with a good visual experience, narrowing the border has become an important development direction of the display panel.

The display panel generally includes a display substrate and a touch layer, and the touch layer is located above an encapsulation layer of the display substrate. The touch layer includes a touch electrode and a touch wire, and the touch wire is used for connecting the touch electrode and a drive circuit to realize a touch function of the display panel. However, the touch wire is usually laid out in a border area of the touch layer, which greatly limits the further development of narrow border of the display panel and does not conform to the development trend of narrow border of the display apparatus.

SUMMARY

The following is a summary of subject matters described herein in detail. This summary is not intended to limit the protection scope of the claims.

In a first aspect, an embodiment of the present disclosure provides a display panel. The display panel has a display area and a non-display area surrounding the display area. The non-display area includes a border area. The display panel includes: a display substrate including a first metal layer provided with metal leads; a touch layer located on an upper layer of the display substrate and provided with touch electrodes and touch wires connected to the touch electrodes, the touch electrodes being located in the display area; a drive circuit provided in the non-display area; and wire passage holes located in the border area, the touch wires being connected to the metal leads of the first metal layer through the wire passage holes, and the metal leads being configured to be connected to the drive circuit.

In the embodiment of the present disclosure, by providing the wire passage holes in the border area of the display panel, the touch wires connected to the touch electrodes are connected to the metal leads of the first metal layer through the wire passage holes, and the metal leads are connected to the drive circuit, so that a touch signal between the touch electrodes and the drive circuit is transmitted through the touch wires and the metal leads.

In some embodiments of the present disclosure, the display substrate further includes a base substrate layer, a drive layer, a display layer, and an encapsulation layer that are sequentially stacked.

In some embodiments of the present disclosure, the touch layer is located on a side of the encapsulation layer away from the base substrate layer.

In some embodiments of the present disclosure, the touch wires enter the wire passage holes in a direction parallel to the encapsulation layer at the border area, and are connected to the metal leads.

In some embodiments of the present disclosure, the display panel further includes a first isolation dam, a second isolation dam and a crack dam that are provided around the display area. The first isolation dam, the second isolation dam and the crack dam are located in the non-display area. The second isolation dam is located on a side of the first isolation dam away from the display area, the crack dam is located on a side of the second isolation dam away from the display area, and the wire passage holes are located between the second isolation dam and the crack dam.

In some embodiments of the present disclosure, the base substrate layer includes a first base plate and a second base plate, and the first metal layer is located between the first base plate and the second base plate.

In some embodiments of the present disclosure, the display panel further includes a second metal layer located in the drive layer. The wire passage holes include a first wire passage hole and a second wire passage hole, a touch wire is lapped with the second metal layer through the first wire passage hole, and the second metal layer is lapped with the first metal layer through the second wire passage hole.

In some embodiments of the present disclosure, the drive layer includes a first insulating layer, a second insulating layer, an interlayer dielectric layer, and a planarization layer that are stacked. The second metal layer is located between the first insulating layer and the second insulating layer, or the second metal layer is located between the second insulating layer and the interlayer dielectric layer.

In some embodiments of the present disclosure, the display panel further includes a second metal layer and a third metal layer. The second metal layer and the third metal layer are located in the drive layer. The wire passage holes include a first wire passage hole, a second wire passage hole and a third wire passage hole. A touch wire is lapped with the third metal layer through the first wire passage hole, the third metal layer is lapped with the second metal layer through the second wire passage hole, and the second metal layer is lapped with the first metal layer through the third wire passage hole.

In some embodiments of the present disclosure, the drive layer includes a first insulating layer, a second insulating layer, an interlayer dielectric layer, and a planarization layer that are stacked. The second metal layer is located between the first insulating layer and the second insulating layer, and the third metal layer is located between the second insulating layer and the interlayer dielectric layer.

In some embodiments of the present disclosure, the touch electrodes include touch emitting electrodes and touch receiving electrodes. The touch emitting electrodes and the touch receiving electrodes are insulatively cross-arranged. The touch wires include first touch wires and second touch wires, and the metal leads include first metal leads and second metal leads. One end of a first touch wire is connected to a touch emitting electrode, and the other end of the first touch wire is connected to a first metal lead. The first touch wire extends to a wire passage hole in a first direction. One end of a second touch wire is connected to a touch receiving electrode, and the other end of the second touch wire is connected to a second metal lead. The second touch wire extends to a wire passage hole in a second direction.

In some embodiments of the present disclosure, the drive layer is provided with a thin film transistor in the display area, and the thin film transistor includes a gate, an active region, a source and a drain. The source and the drain are connected to the active region through vias provided in the first insulating layer, the second insulating layer and the interlayer dielectric layer.

In some embodiments of the present disclosure, the non-display area further includes a bending area and a bonding area adjacent to the bending area. The bending area is located on a side of the border area away from the display area, and the bonding area is located on a side of the bending area away from the border area. The drive circuit is located in the bonding area, the bending area is provided with a signal lead connected to the drive circuit. The signal lead is used for transmitting a signal, and the signal lead is provided in the same layer as the metal leads.

In a second aspect, an embodiment of the present disclosure provides a display apparatus, including the display panel according to any one of the above embodiments. Other aspects of the present disclosure may be comprehended after the drawings and the detailed descriptions are read and understood.

BRIEF DESCRIPTION OF DRAWINGS

The drawings described below are only some embodiments of the present disclosure and other embodiments may be obtained from the drawings for those skilled in the art.

DETAILED DESCRIPTION

Figure 1:
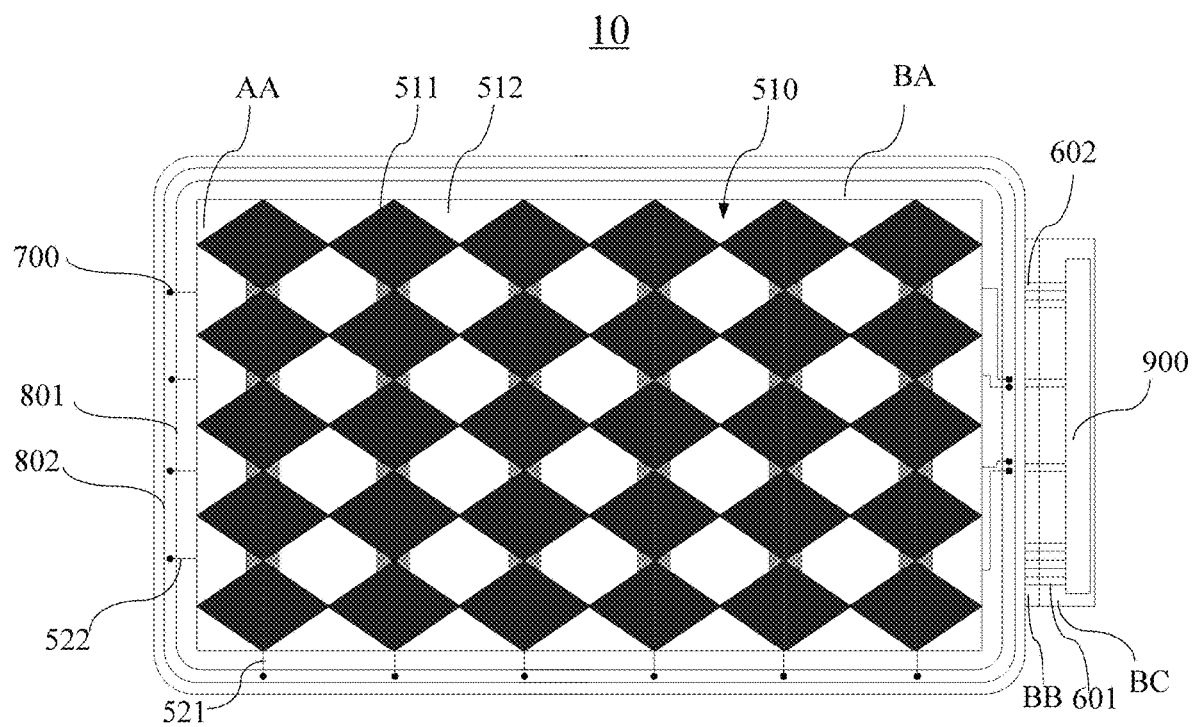
FIG. 1 is a schematic diagram of a display panel provided by an embodiment of the present disclosure.

The technical schemes in the embodiments of present application will be described clearly and completely with reference to the drawings in the embodiments of present application. The described embodiments are only part of the embodiments of the present application, rather than all of the embodiments. All other embodiments obtained by those skilled in the art based on the embodiments of the present application fall within the protection scope of the present application.

As shown in FIGS. 1 to 8, embodiments of the present disclosure provide a display panel 10. The display panel 10 has a display area AA and a non-display area surrounding the display area AA. The non-display area includes a border area BA. The display panel 10 includes a display substrate, a touch layer 500, a drive circuit 900, and wire passage holes 700. The display substrate includes a first metal layer 600 provided with metal leads. The touch layer 500 is located on an upper layer of the display substrate, and is provided with touch electrodes 510 and touch wires 520 connected to the touch electrodes 510. The touch electrodes 510 are located in the display area AA. The drive circuit 900 is provided in the non-display area. The wire passage holes 700 are located in the border area BA, and the touch wires 520 are connected to the metal leads of the first metal layer 600 through the wire passage holes 700, and the metal leads are configured to be connected to the drive circuit 900.

According to an embodiment of the present disclosure, by providing the wire passage holes 700, the touch wires 520 are connected to the metal leads after passing through the wire passage holes 700, which prevents the touch wires 520 from extending on an encapsulation layer 400 in a vertical direction of the encapsulation layer 400, reduces the flatness requirement of the encapsulation layer 400 in the border area BA, and reduces the size of the border area BA.

In an exemplary embodiment, the display panel further includes a base substrate layer 100, a drive layer 200, a display layer 300, and an encapsulation layer 400 that are sequentially stacked. In an exemplary embodiment, the touch layer 500 is located on a side of the encapsulation layer 400 away from the base substrate layer 100.

In an exemplary embodiment, when the touch wires 520 enter the wire passage holes 700 in a direction parallel to the encapsulation layer 400 at the border area BA (e.g., a ramp direction) to be connected to the metal leads, the influence of the leveling ramp on the touch wires 520 may be reduced, thereby reducing the flatness requirement of the encapsulation layer 400 in the border area BA and reducing the size of the border area BA.

Figure 2:
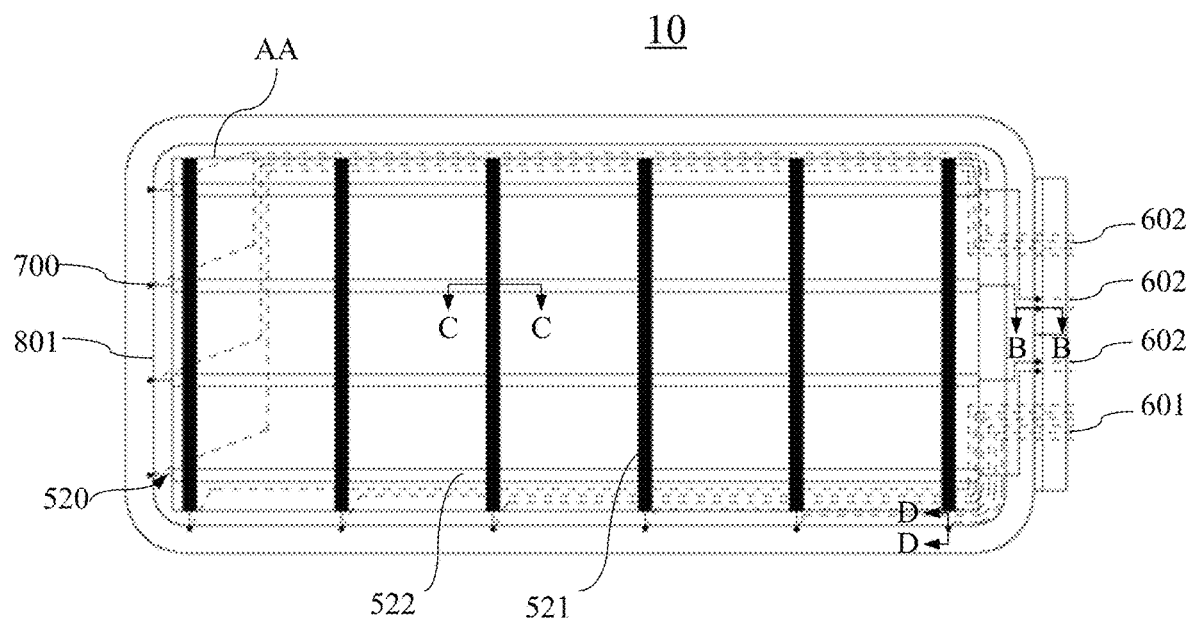
FIG. 2 is a schematic diagram of wiring of a display panel provided by an embodiment of the present disclosure.

In exemplary embodiments, as shown in FIGS. 1 and 2, an embodiment of a first aspect of the present disclosure provides a display panel 10. The display panel 10 has a display area AA and a non-display area surrounding the display area AA. The non-display area includes a border area BA. The display panel 10 includes a display substrate, a touch layer 500, a drive circuit 900, and wire passage holes 700. The display substrate includes a base substrate layer 100, a drive layer 200, a display layer 300, and an encapsulation layer 400 that are sequentially stacked. The touch layer 500 is located on a side of the encapsulation layer 400 away from the display layer 300 and is provided with touch electrodes 510 and touch wires 520 connected to the touch electrodes 510. The touch electrodes 510 are located in the display area AA. The drive circuit 900 is provided in the non-display area. The wire passage holes 700 are located in the border area BA, and the display substrate further includes a first metal layer 600 provided with metal leads. The touch wires 520 are connected to the metal leads through the wire passage holes 700, and the metal leads are configured to be connected to the drive circuit 900.

In the embodiment of the present disclosure, by providing the wire passage holes 700 in the border area BA of the display panel 10, the touch wires 520 connected to the touch electrodes 510 are connected to the metal leads of the first metal layer 600 through the wire passage holes 700, and the metal leads are connected to the drive circuit 900, so that touch signals between the touch electrodes 510 and the drive circuit 900 are transmitted through the touch wires 520 and the metal leads. In the related art, the encapsulation layer 400 generally includes an organic encapsulation layer 402, which has poor thickness consistency in the border area BA and has a leveling ramp. The touch wires 520 extend both in a direction parallel to the leveling ramp and in a direction perpendicular to the leveling ramp during connection to the drive circuit 900. The touch wires 520 extending in the direction perpendicular to the leveling ramp are prone to short circuit or open circuit. Therefore, in the related art, there is a higher requirement for the flatness of the organic encapsulation layer 402 in the border area BA. Accordingly, in order to ensure the flatness of the organic encapsulation layer 402 and the safe wiring space of the touch wires 520, the size of the border area BA is designed to be larger. Compared with the related art, by providing the wire passage holes 700 in the embodiment of the present disclosure, the touch wires 520 enter the wire passage holes 700 in the direction parallel to the leveling ramp and then are connected to the metal leads, which prevents the touch wires 520 from extending on the encapsulation layer 400 in the direction perpendicular to the leveling ramp and reduces the influence of the leveling ramp on the touch wires 520, thereby reducing the flatness requirement of the encapsulation layer 400 in the border area BA and reducing the size of the border area BA. In addition, since the first metal layer 600 is located on the display substrate, the metal leads may be located not only in the border area BA but also in the display area AA, so that the size of the border area BA may be further reduced, and the wiring difficulty of the touch wires 520 and the metal leads may be reduced.

In some embodiments of the present disclosure, the touch layer 500 is formed directly on the display substrate using Flexible Multilayer on Cell (FMLOC) technology. The touch layer 500 may include a touch metal layer, a touch insulating layer 503, a barrier layer 501, a protective film layer 505, and the like. These film layers are directly prepared on the encapsulation layer 400 of the display substrate by deposition, exposure, development, etching and the like, thereby realizing integration with the display substrate and facilitating thinning of the display apparatus. The touch metal layer is used to form the touch electrodes 510 in the display area AA and the touch wires 520 in the border area BA.

In other embodiments of the present disclosure, the touch layer 500 may further have more or fewer film layers as long as it includes the necessary touch metal layers for forming the touch electrodes 510 and the touch wires 520.

As shown in FIGS. 1 and 2, in some embodiments of the present disclosure, the touch electrodes 510 include touch emitting electrodes 511 and touch receiving electrodes 512, which are insulatively cross-arranged. The touch wires 520 include first touch wires 521 and second touch wires 522. The metal leads include first metal leads 601 and second metal leads 602. One end of a first touch wire 521 is connected to a touch emitting electrode 511, and the other end of the first touch wire 521 is connected to a first metal lead 601. The first touch wire 521 extends to a wire passage hole 700 in a vertical direction. One end of a second touch wire 522 is connected to a touch receiving electrode 512, and the other end of the second touch wire 522 is connected to a second metal lead 602. The second touch wire 522 extends to a wire passage hole 700 in a horizontal direction. In embodiments of the present disclosure, touch function is realized by adopting the mutual capacitive touch control principle. Specifically, when the user touches the touch layer 500, a capacitance between the touch emitting electrode 511 and the touch receiving electrode 512 at the touch position will be changed. The drive circuit 900 transmits a transmission signal to the touch emitting electrode 511 through the first metal lead 601 and the first touch wire 521, and receives a signal from the touch receiving electrode 512 through the second touch wire 522 and the second metal lead 602, thereby obtaining a capacitance value of at an intersection point of the touch emitting electrode 511 and the touch receiving electrode 512, that is, the capacitance value of the whole two-dimensional plane of the display panel 10. According to an amount of the change of the capacitance value, coordinates of a touch point are calculated, thereby realizing the touch function.

Figure 8:
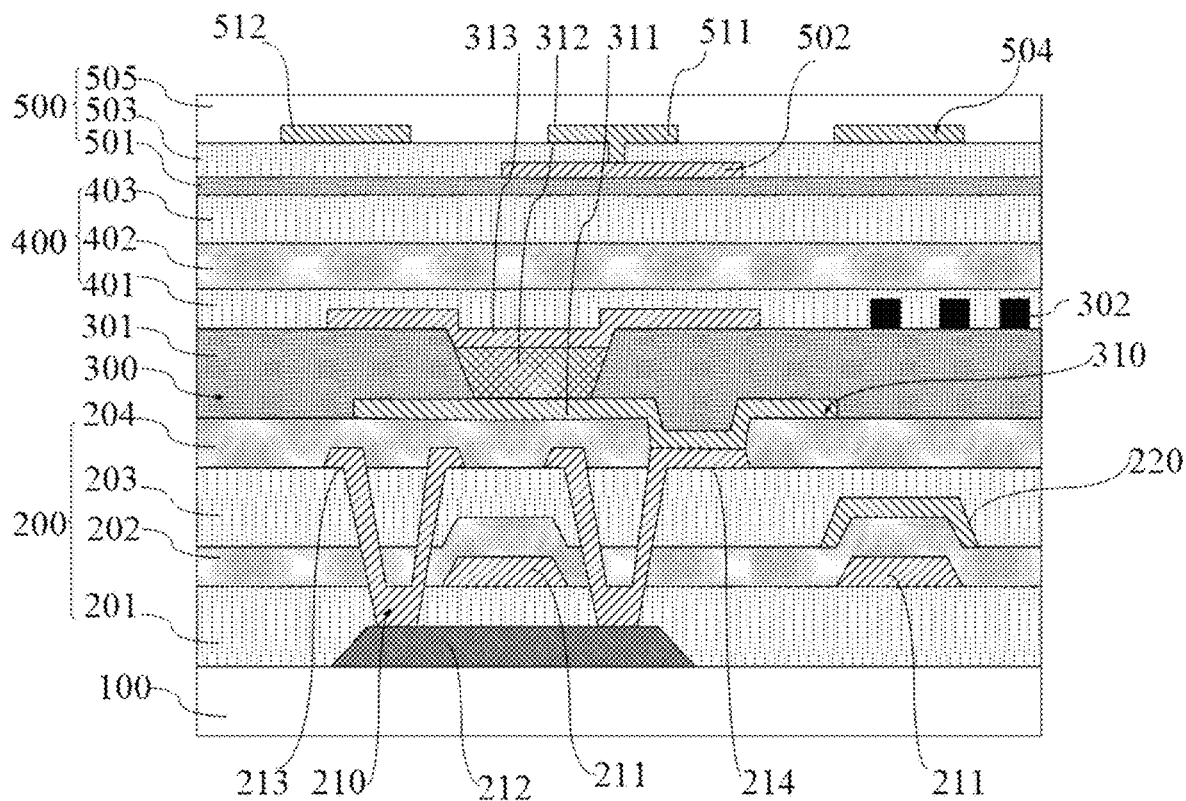
FIG. 8 is a sectional view at C-C of a display panel provided by an embodiment of the present disclosure.

As shown in FIG. 8, in the display area AA, the touch layer 500 includes a buffer layer 501, a first touch metal layer 502, a touch insulating layer 503, a second touch metal layer 504, and a protective film layer 505. Touch emitting electrodes 511 and touch receiving electrodes 512 are located in the second touch metal layer 504, and the touch emitting electrodes 511 and touch receiving electrodes 512 are insulatively cross-arranged on the second touch metal layer 504. The touch receiving electrodes 512 are directly communicated on the second touch metal layer 504, the touch emitting electrodes 511 are conductive through the first touch metal layer 502, and the first touch metal layer 502 is configured to constitute a bridge layer. A first touch wire 521 is jointly formed by the first touch metal layer 502 and the second touch metal layer 504 in the non-display area, and a second touch wire 522 is jointly formed by the first touch metal layer 502 and the second touch metal layer 504 in the non-display area, so that the touch wires 520 have a larger diameter, thereby reducing the impedance.

As shown in FIGS. 3-7, in some embodiments of the present disclosure, the display panel 10 further includes a first isolation dam 800, a second isolation dam 801, and a crack dam 802 that are provided around the display area AA. The first isolation dam 800, the second isolation dam 801, and the crack dam 802 are located in the non-display area. The second isolation dam 801 is located on a side of the first isolation dam 800 away from the display area AA, the crack dam 802 is located on a side of the second isolation dam 801 away from the display area AA, and the wire passage holes 700 are located between the second isolation dam 801 and the crack dam 802. In the embodiment of the present disclosure, by providing the first isolation dam 800, the organic encapsulation layer 402 is blocked; by providing the second isolation dam 801, the organic encapsulation layer 402 is further blocked and the organic encapsulation layer 402 is prevented from crossing the first isolation dam 800; by providing the crack dam 802, cracks in the non-display area are prevented from extending to the display area AA; by providing the wire passage holes 700 between the second isolation dam 801 and the crack dam 802, the wire passage holes 700 do not need to pass through the encapsulation layer 400 during processing, and there is fewer film layers at the position of the wire passage holes 700, which is convenient for processing.

Exemplarily, the first isolation dam 800 and the second isolation dam 801 are protrusions having a certain height. In an embodiment, the drive layer 200 includes a planarization layer 204, the display layer 300 includes a pixel definition layer 301 and a spacer 302, and the encapsulation layer 400 includes a first inorganic encapsulation layer 401, an organic encapsulation layer 402, and a second inorganic encapsulation layer 403 that are stacked. The first isolation dam 800 is formed by superimposing the pixel definition layer 301 and the spacer 302 of the display layer 300, that is, a first portion of the first isolation dam 800 is formed when the pixel definition layer 301 is formed, and a second portion of the first isolation dam 800 is formed when the spacer 302 is formed. Since the organic encapsulation layer 402 generally has certain fluidity, the primary function of the first isolation dam 800 is used to block organic matters in the encapsulation layer 400. The second isolation dam 801 is formed by superimposing the planarization layer 204 of the drive layer 200, and the pixel definition layer 301 and the spacer 302 of the display layer 300, that is, a first portion of the second isolation dam 801 is formed when the planarization layer 204 is formed, a second portion of the second isolation dam 801 is formed when the pixel definition layer 301 is formed, and a third portion of the second isolation dam 801 is formed when the spacer 302 is formed. The second isolation dam 801 is used to further block the organic encapsulation layer 402, and prevent the organic encapsulation layer 402 from crossing the first isolation dam 800. The crack dam 802 includes a plurality of cut channels. By providing the crack dam 802, cracks in the non-display area are prevented from extending to the display area AA.

In some embodiments of the present disclosure, the base substrate layer 100 may include a first base plate 101 and a second base plate 102 that are stacked. The first metal layer 600 is located between the first base plate 101 and the second base plate 102. In an embodiment of the present disclosure, arrangement of metal leads is facilitated by providing the first metal layer 600 between the first base plate 101 and the second base plate 102.

The first base plate 101 and the second base plate 102 may be made of a flexible insulating material. For example, they may be made of a polymer material such as polyimide, polycarbonate, polyethersulfone, polyethylene terephthalate, polyethylene naphthalate, polyaryl compound or glass fiber reinforced plastic.

Further, the base substrate layer 100 may further include a buffer layer 103 for blocking water oxygen and basic ions.

Figure 5:
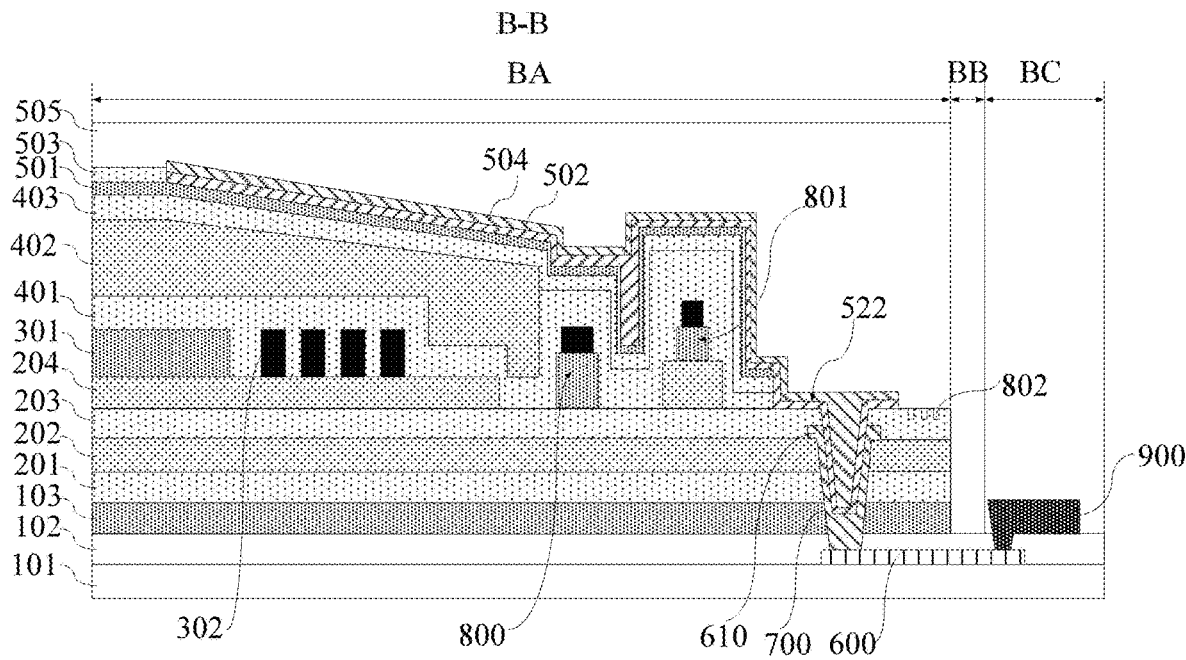
FIG. 5 is a sectional view at B-B of a display panel provided by a second embodiment of the present disclosure.
Figure 6:
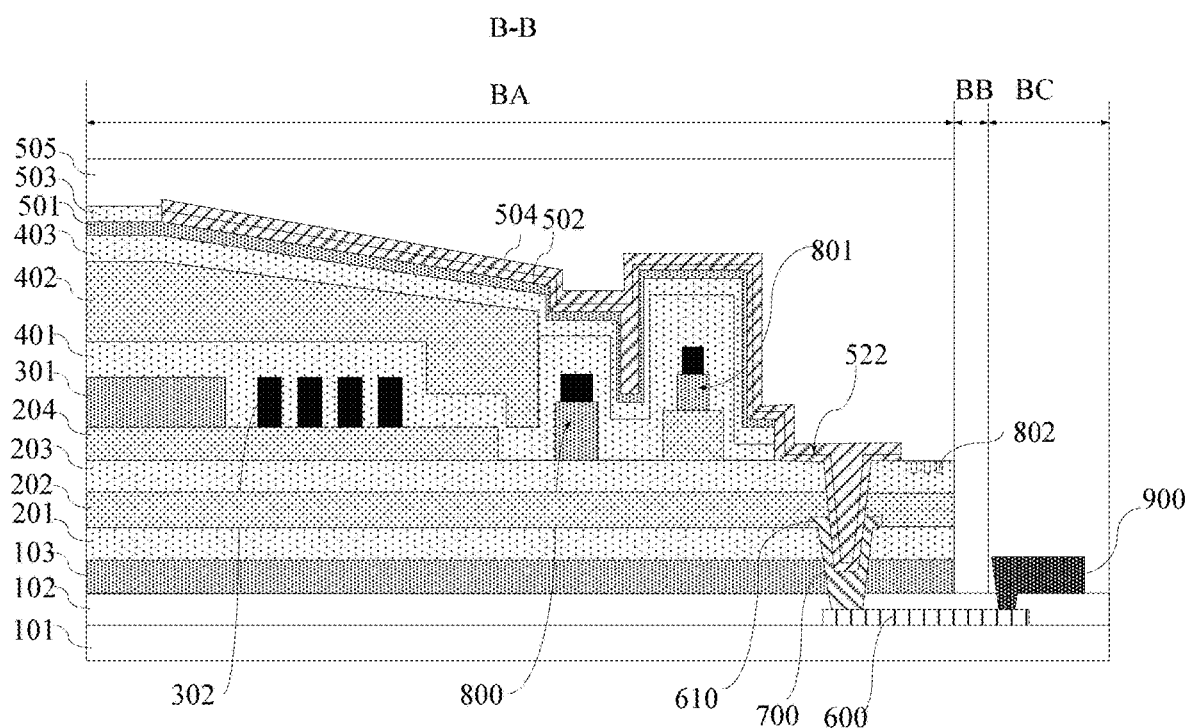
FIG. 6 is a sectional view at B-B of a display panel provided by a third embodiment of the present disclosure.

As shown in FIGS. 5 and 6, in some embodiments of the present disclosure, the display panel 10 further includes a second metal layer 610 located on the drive layer 200. The wire passage holes 700 include a first wire passage hole and a second wire passage hole. A touch wire 520 (522 in figures) is lapped with the second metal layer 610 through the first wire passage hole, and the second metal layer 610 is lapped with the first metal layer 600 through the second wire passage hole. In an embodiment of the present disclosure, by providing the second metal layer 610, the sizes of the first wire passage hole and the second wire passage hole in a direction perpendicular to the display panel 10 are shorter, thereby facilitating the improvement of the processing accuracy of the wire passage hole 700.

As shown in FIGS. 6 and 8, in some embodiments of the present disclosure, the drive layer 200 includes a first insulating layer 201, a second insulating layer 202, an interlayer dielectric layer 203, and a planarization layer 204 that are sequentially stacked. The second metal layer 610 is located between the first insulating layer 201 and the second insulating layer 202. Considering that in the display area AA, the drive layer 200 generally includes a thin film transistor 210, and a gate 211 of the thin film transistor 210 is generally provided between the first insulating layer 201 and the second insulating layer 202, providing the second metal layer 610 between the first insulating layer 201 and the second insulating layer 202 will facilitate the provision of the second metal layer 610 and the gate 211 on a same layer, thereby facilitating the processing of the second metal layer 610.

As shown in FIGS. 5 and 8, in some embodiments of the present disclosure, the drive layer 200 includes a first insulating layer 201, a second insulating layer 202, an interlayer dielectric layer 203, and a planarization layer 204 that are sequentially stacked. The second metal layer 610 is located between the second insulating layer 202 and the interlayer dielectric layer 203. Considering that in the display area AA, the drive layer 200 generally includes a capacitor electrode 220 for storing electric charges, and the capacitor electrode 220 is generally provided between the second insulating layer 202 and the interlayer dielectric layer 203, providing the second metal layer 610 between the second insulating layer 202 and the interlayer dielectric layer 203 will facilitate the provision of the second metal layer 610 and the capacitor electrode 220 on a same layer, thereby facilitating the processing of the second metal layer 610.

Exemplarily, the first insulating layer 201, the second insulating layer 202 and the interlayer dielectric layer 203 may be made of a material such as silicon nitride or silicon oxide, and may be a single layer, or may be a multi-layer structure of silicon nitride or silicon oxide. The planarization layer 204 may be made of an organic material such as polyimide, acrylic, or polyethylene terephthalate.

Figure 7:
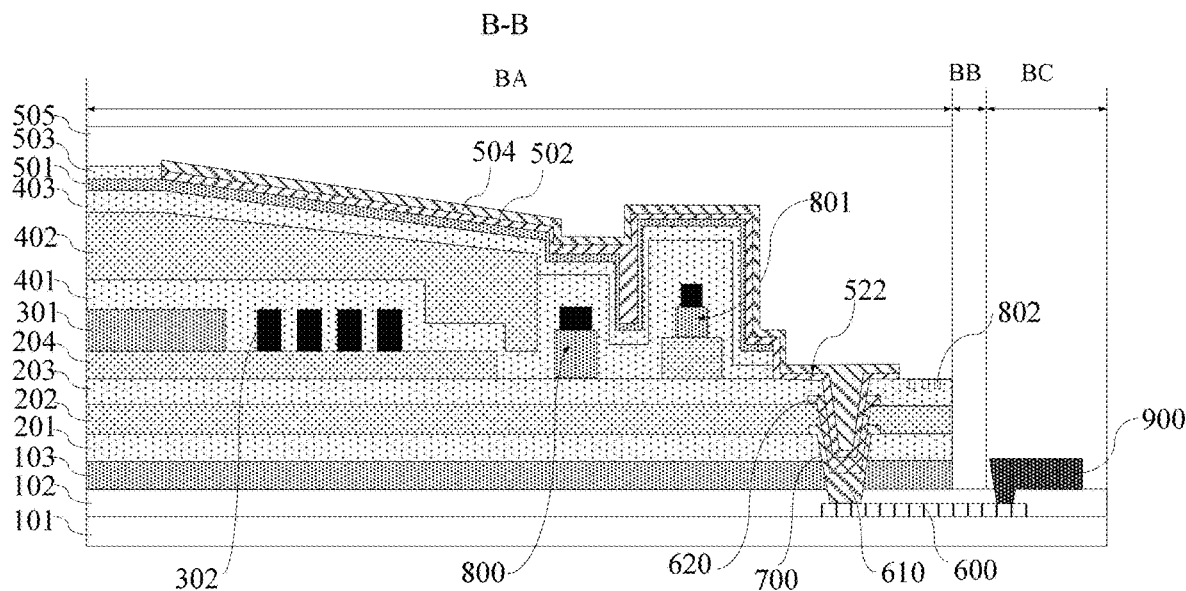
FIG. 7 is a sectional view at B-B of a display panel provided by a fourth embodiment of the present disclosure.

As shown in FIG. 7, in some embodiments of the present disclosure, the display panel 10 includes a second metal layer 610 and a third metal layer 620. The second metal layer 610 and the third metal layer 620 are located in the display layer 200. The wire passage holes 700 include a first wire passage hole, a second wire passage hole, and a third wire passage hole. A touch wire 520 (522 in Figures) is lapped with the third metal layer 620 through the first wire passage hole, the third metal layer 620 is lapped with the second metal layer 610 through the second wire passage hole, and the second metal layer 610 is lapped with the first metal layer 600 through the third wire passage hole. In the embodiment of the present disclosure, by providing the second metal layer 610 and the third metal layer 620, the sizes of the first wire passage hole, the second wire passage hole, and the third wire passage hole in a direction perpendicular to the display panel 10 are shorter, thereby facilitating the improvement of the processing accuracy of the wire passage hole 700.

In some embodiments of the present disclosure, the drive layer 200 includes a first insulating layer 201, a second insulating layer 202, an interlayer dielectric layer 203, and a planarization layer 204 that are sequentially stacked. The first insulating layer 201 and the second insulating layer 202 may also be referred to as gate insulating layers, a second metal layer 610 is located between the first gate insulating layer 201 and the second gate insulating layer 202, and a third metal layer 620 is located between the second gate insulating layer 202 and the interlayer dielectric layer 203. Thus, this facilitates the provision of the second metal layer 610 and the third metal layer 620.

As shown in FIG. 8, in some embodiments of the present disclosure, the drive layer 200 is provided with a thin film transistor 210 in the display area AA. The thin film transistor 210 includes a gate 211, an active region 212, a source 213, and a drain 214. The source 213 and the drain 214 are connected to the active region 212 through vias provided in the first insulating layer 201, the second insulating layer 202, and the interlayer dielectric layer 203. In the embodiment of the present disclosure, an organic light emitting device 310 is controlled by providing the thin film transistor 210.

Exemplarily, the thin film transistor 210 may adopt a top gate structure, in which the active region 212 is provided above the base substrate layer 100, the first insulating layer 201 covers the active region 212, the gate 211 is provided above the first insulating layer 201, the second insulating layer 202 covers the gate 211, the source 213 and the drain 214 are provided above the interlayer dielectric layer 203, and a planarization layer 204 covers the source 213 and the drain 214. The source 213 and the drain 214 are connected to the active region 212 through vias provided in the first insulating layer 201, the second insulating layer 202 and the interlayer dielectric layer 203. The display layer 300 is provided with an organic light emitting device 310 in the display area AA, and the organic light emitting device 310 includes an anode 311, a light emitting layer 312, and a cathode 313. The anode 311 of the organic light emitting device 310 is connected to the drain 214 of the thin film transistor 210 through a via provided in the planarization layer 204.

In some embodiments of the present disclosure, the thin film transistor 210 further includes a capacitor electrode 220 that forms a storage capacitor with the gate 211. The storage capacitor is configured to store electric charges, and to hold a voltage constant when a display screen is refreshed.

Alternatively, the second metal layer 610 is provided in the same layer as the gate 211, and the third metal layer 620 is provided in the same layer as the capacitor electrode 220. Thus, the second metal layer 610 and the gate 211 may be formed by a one-time patterning process, and the second metal layer 610 and the capacitor electrode 220 may be formed by a one-time patterning process, thereby reducing the preparation process, saving the cost and facilitating the lightening and thinning of the display apparatus.

Figure 3:
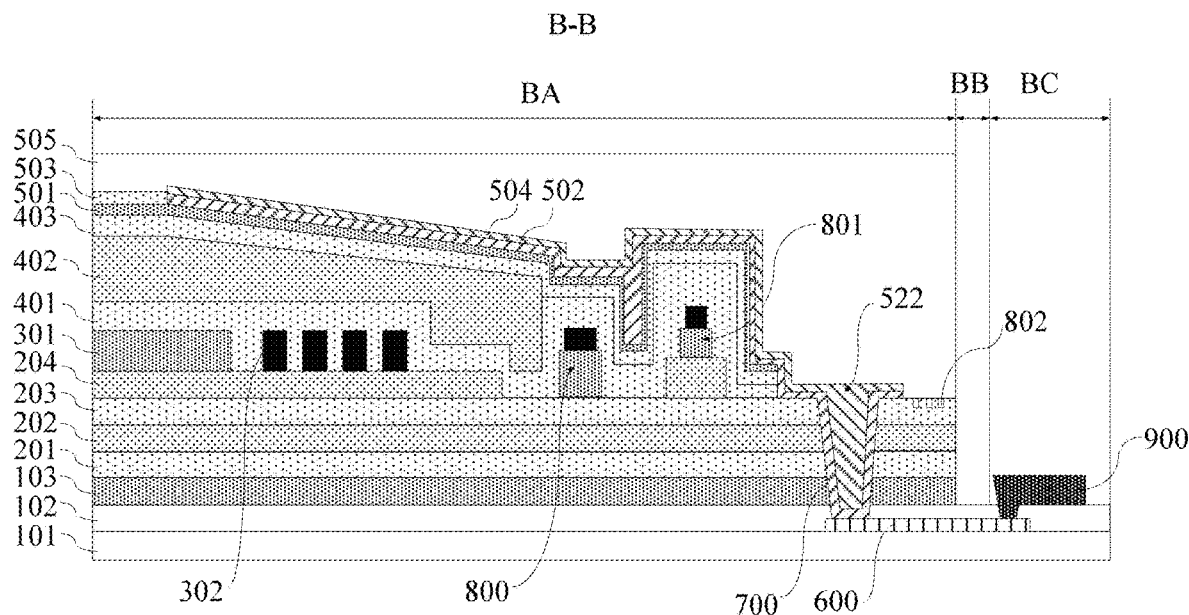
FIG. 3 is a sectional view at B-B of a display panel provided by a first embodiment of the present disclosure.
Figure 4:
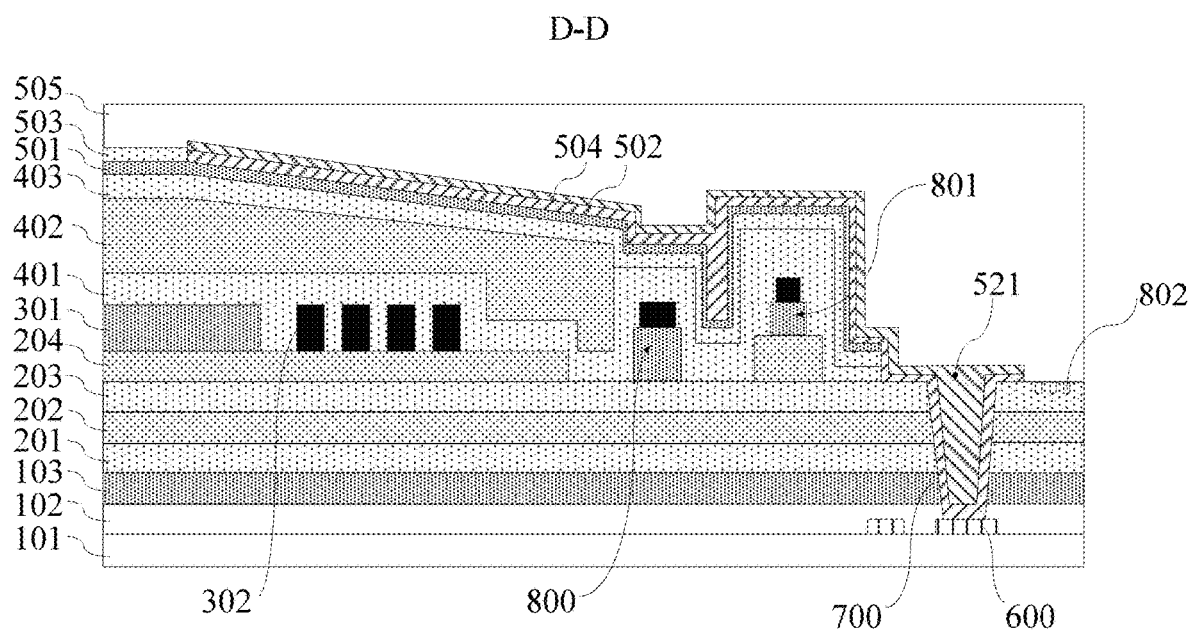
FIG. 4 is a sectional view at D-D of a display panel provided by a first embodiment of the present disclosure.

As shown in FIGS. 1 and 3, in some embodiments of the present disclosure, the non-display area further includes a bending area BB and a bonding area BC adjacent to the bending area BB. The bending area BB is located on a side of the border area BA away from the display area AA, and the bonding area BC is located on a side of the bending area BB away from the border area BA. The drive circuit 900 is located in the bonding area BC, the bending area BB is provided with signal leads connected to the drive circuit 900. The signal leads are used for transmitting signals, and are provided in the same layer as the metal leads. In some techniques, the signal leads are typically provided in the same layer as the source 213 and the drain 214 of the display area AA, and a film layer of the bending area BB includes a base substrate layer 100, a source-drain layer, a planarization layer 204, and a pixel definition layer 301. Compared with the above technology, in the embodiment of the present disclosure, by providing the signal leads and the metal leads in the same layer, touch signals may be transmitted between the metal leads and the signal leads in the same layer, and the times of film jumping is reduced, thereby reducing a lap resistance and improving touch sensitivity and process yield.

An embodiment of the present disclosure further provides a display apparatus, including the display panel 10 of any one of the above embodiments.

The display apparatus of the embodiment of the present disclosure includes the display panel 10. By providing the wire passage holes 700 in the border area BA of the display panel 10, the touch wires 520 connected to the touch electrodes 510 are connected to the metal leads of the first metal layer 600 through the wire passage holes 700, and the metal leads are connected to the drive circuit 900, so that touch signals between the touch electrodes 510 and the drive circuit 900 are transmitted through the touch wires 520 and the metal leads. In some techniques, the encapsulation layer 400 generally includes an organic encapsulation layer 402, which has poor thickness consistency in the border area BA and has a leveling ramp. The touch wires 520 extend both in a direction parallel to the leveling ramp and in a direction perpendicular to the leveling ramp during connection to the drive circuit 900. The touch wires 520 extending in the direction perpendicular to the leveling ramp are prone to short circuit or open circuit. Therefore, in the above techniques, there is a higher requirement for the flatness of the organic encapsulation layer 402 in the border area BA. Accordingly, in order to ensure the flatness of the organic encapsulation layer 402 and the safe wiring space of the touch wires 520, the size of the border area BA is designed to be larger. Compared with the related art, by providing the wire passage holes 700 in the embodiment of the present disclosure, the touch wires 520 enter the wire passage holes 700 in the direction parallel to the leveling ramp and then are connected to the metal leads, which prevents the touch wires 520 from extending on the encapsulation layer 400 in the direction perpendicular to the leveling ramp and reduces the influence of the leveling ramp on the touch wires 520, thereby reducing the flatness requirement of the encapsulation layer 400 in the border area BA and reducing the size of the border area BA. In addition, since the first metal layer 600 is located on the display substrate, the metal leads may be located in the display area AA during wiring, so that the border size may be further reduced, and the wiring difficulty of the touch wires 520 and the metal leads may be reduced.

In the present disclosure, "parallel" refers to a state in which an angle formed by two straight lines is above −10° and below 10°, and thus may include a state in which the angle is above −5° and below 5°. In addition, "perpendicular" refers to a state in which an angle formed by two straight lines is above 80° and below 100°, and thus may include a state in which the angle is above 85° and below 95°.

It should be noted that relational terms such as first and second are used herein only to distinguish one entity or operation from another entity or operation and do not necessarily require or imply any such actual relationship or order between these entities or operations. Moreover, the terms "include", "comprise" or any other variations thereof are intended to cover a non-exclusive inclusion, such that a process, method, article, or device that includes a series of elements includes not only those elements but also includes other elements which are not expressly listed, or further includes elements inherent to such a process, method, article, or device. Without more limitations, an element modified by "include one . . . " does not exclude that the process, method, object, or device that includes the element includes another identical element.

Each of the embodiments in this specification is described in a related manner and the same and similar parts between the embodiments can be referred to each other. Each embodiment focuses on the differences from other embodiments. Particularly, for the system embodiment, since it is substantially similar to the method embodiment, the description is relatively simple and reference can be made to the partial description of the method embodiment where relevant.

The above are only alternative embodiments of the present application, and are not intended to limit the protection scope of the present application. Any modification, equivalent substitution, improvement and the like made within the spirit and principles of the present application are included in the protection scope of the present application.

The invention claimed is:

1. A display panel having a display area and a non-display area surrounding the display area, the non-display area comprising a border area, the display panel comprising:
   a display substrate comprising a first metal layer provided with metal leads;

a touch layer located on an upper layer of the display substrate and provided with touch electrodes and touch wires connected to the touch electrodes, the touch electrodes being located in the display area;

a drive circuit provided in the non-display area; and wire passage holes located in the border area, the touch wires being connected to the metal leads of the first metal layer through the wire passage holes, and the metal leads being configured to be connected to the drive circuit;

wherein the touch electrodes comprise touch emitting electrodes and touch receiving electrodes; the touch emitting electrodes and the touch receiving electrodes are insulatively cross-arranged; the touch wires comprises first touch wires and second touch wires; the metal leads comprises first metal leads and second metal leads; one end of a first touch wire is connected to a touch emitting electrode, and the other end of the first touch wire is connected to a first metal lead; the first touch wire extends to a wire passage hole in a first direction; one end of a second touch wire is connected to a touch receiving electrode, and the other end of the second touch wire is connected to a second metal lead; and the second touch wire extends to a wire passage hole in a second direction.

2. The display panel according to claim 1, wherein the display substrate further comprises a base substrate layer, a drive layer, a display layer, and an encapsulation layer that are sequentially stacked.

3. The display panel according to claim 2, wherein the touch layer is located on a side of the encapsulation layer away from the base substrate layer.

4. The display panel according to claim 1, wherein the touch wires enter the wire passage holes in a direction parallel to the encapsulation layer at the border area, and are connected to the metal leads.

5. The display panel according to claim 1, further comprising a first isolation dam, a second isolation dam and a crack dam that are provided around the display area, wherein the first isolation dam, the second isolation dam and the crack dam are located in the non-display area, the second isolation dam is located on a side of the first isolation dam away from the display area, the crack dam is located on a side of the second isolation dam away from the display area, and the wire passage holes are located between the second isolation dam and the crack dam.

6. The display panel according to claim 1, wherein the base substrate layer comprises a first base plate and a second base plate, and the first metal layer is located between the first base plate and the second base plate.

7. The display panel according to claim 6, further comprising a second metal layer located in the drive layer, wherein the wire passage holes comprise a first wire passage hole and a second wire passage hole, a touch wire is lapped with the second metal layer through the first wire passage hole, and the second metal layer is lapped with the first metal layer through the second wire passage hole.

8. The display panel according to claim 7, wherein the drive layer comprises a first insulating layer, a second insulating layer, an interlayer dielectric layer, and a planarization layer that are stacked, the second metal layer is located between the first insulating layer and the second insulating layer, or the second metal layer is located between the second insulating layer and the interlayer dielectric layer.

9. The display panel according to claim 6, further comprising a second metal layer and a third metal layer, wherein the second metal layer and the third metal layer are located in the drive layer, the wire passage holes comprise a first wire passage hole, a second wire passage hole and a third wire passage hole, a touch wire is lapped with the third metal layer through the first wire passage hole, the third metal layer is lapped with the second metal layer through the second wire passage hole, and the second metal layer is lapped with the first metal layer through the third wire passage hole.

10. The display panel according to claim 9, wherein the drive layer comprises a first insulating layer, a second insulating layer, an interlayer dielectric layer, and a planarization layer that are stacked, the second metal layer is located between the first insulating layer and the second insulating layer, and the third metal layer is located between the second insulating layer and the interlayer dielectric layer.

11. The display panel according to claim 8, wherein the drive layer is provided with a thin film transistor in the display area, the thin film transistor comprises a gate, an active region, a source and a drain, and the source and the drain are connected to the active region through vias provided in the first insulating layer, the second insulating layer and the interlayer dielectric layer.

12. The display panel according to claim 1, wherein the non-display area further comprises a bending area and a bonding area adjacent to the bending area, the bending area is located on a side of the border area away from the display area, the bonding area is located on a side of the bending area away from the border area, the drive circuit is located in the bonding area, the bending area is provided with a signal lead connected to the drive circuit, the signal lead is used for transmitting a signal, and the signal lead is provided in the same layer as the metal leads.

13. A display apparatus, comprising the display panel according to claim 1.

14. The display panel according to claim 2, wherein the touch wires enter the wire passage holes in a direction parallel to the encapsulation layer at the border area, and are connected to the metal leads.

15. The display panel according to claim 3, wherein the touch wires enter the wire passage holes in a direction parallel to the encapsulation layer at the border area, and are connected to the metal leads.

16. The display panel according to claim 10, wherein the drive layer is provided with a thin film transistor in the display area, the thin film transistor comprises a gate, an active region, a source and a drain, and the source and the drain are connected to the active region through vias provided in the first insulating layer, the second insulating layer and the interlayer dielectric layer.

17. A display apparatus, comprising the display panel according to claim 2.

18. A display apparatus, comprising the display panel according to claim 3.

19. A display apparatus, comprising the display panel according to claim 4.

* * * * *